United States Patent
Ou et al.

(10) Patent No.: US 10,736,232 B1
(45) Date of Patent: Aug. 4, 2020

(54) FAN TO BE USED AS A RELAY NODE

(71) Applicant: Dongguan Evn Electronics Co., Ltd., Dongguan, Guangdong Province (CN)

(72) Inventors: Li-Hui Ou, Dongguan (CN); Hank Ching-Tsung Chen, Dongguan (CN); Feng Liang, Dongguan (CN)

(73) Assignee: DONGGUAN EVN ELECTRONICS CO., LTD., Dongguan (CN)

( * ) Notice: Subject to any disclaimer, the term of this patent is extended or adjusted under 35 U.S.C. 154(b) by 0 days.

(21) Appl. No.: 16/399,511

(22) Filed: Apr. 30, 2019

(51) Int. Cl.
*H05K 7/20* (2006.01)

(52) U.S. Cl.
CPC ..... *H05K 7/20209* (2013.01); *H05K 7/20136* (2013.01)

(58) Field of Classification Search
CPC .................................................. H05K 7/20209
USPC ....................................................... 318/34, 3
See application file for complete search history.

(56) References Cited

U.S. PATENT DOCUMENTS 6,359,567 B1 * 3/2002 Park ..................... F24F 11/0001
340/632

FOREIGN PATENT DOCUMENTS

TW            I477056 B       3/2015

* cited by examiner

*Primary Examiner* — David Luo
(74) *Attorney, Agent, or Firm* — Muncy, Geissler, Olds & Lowe, P.C.

(57) ABSTRACT

A fan to be used as a relay node comprises male and female connect ports, a transmission wire set connecting the male and female connect ports, a power acquisition unit, and a signal processing unit. The male connect port is connected to a control source for receiving a working power and a control signal. The female connect port is selectively connectable to the male connect port of another fan to allow the fan electrically connect with another fan. The power acquisition unit is connected in parallel with the transmission wire set for extracting the working power to supply to a driving unit. The signal processing unit is connected to the transmission wire set to obtain and output the control signal to the driving unit, and acts as a relay node to output the control signal to the female connect port, so that the other fan can be controlled.

11 Claims, 7 Drawing Sheets

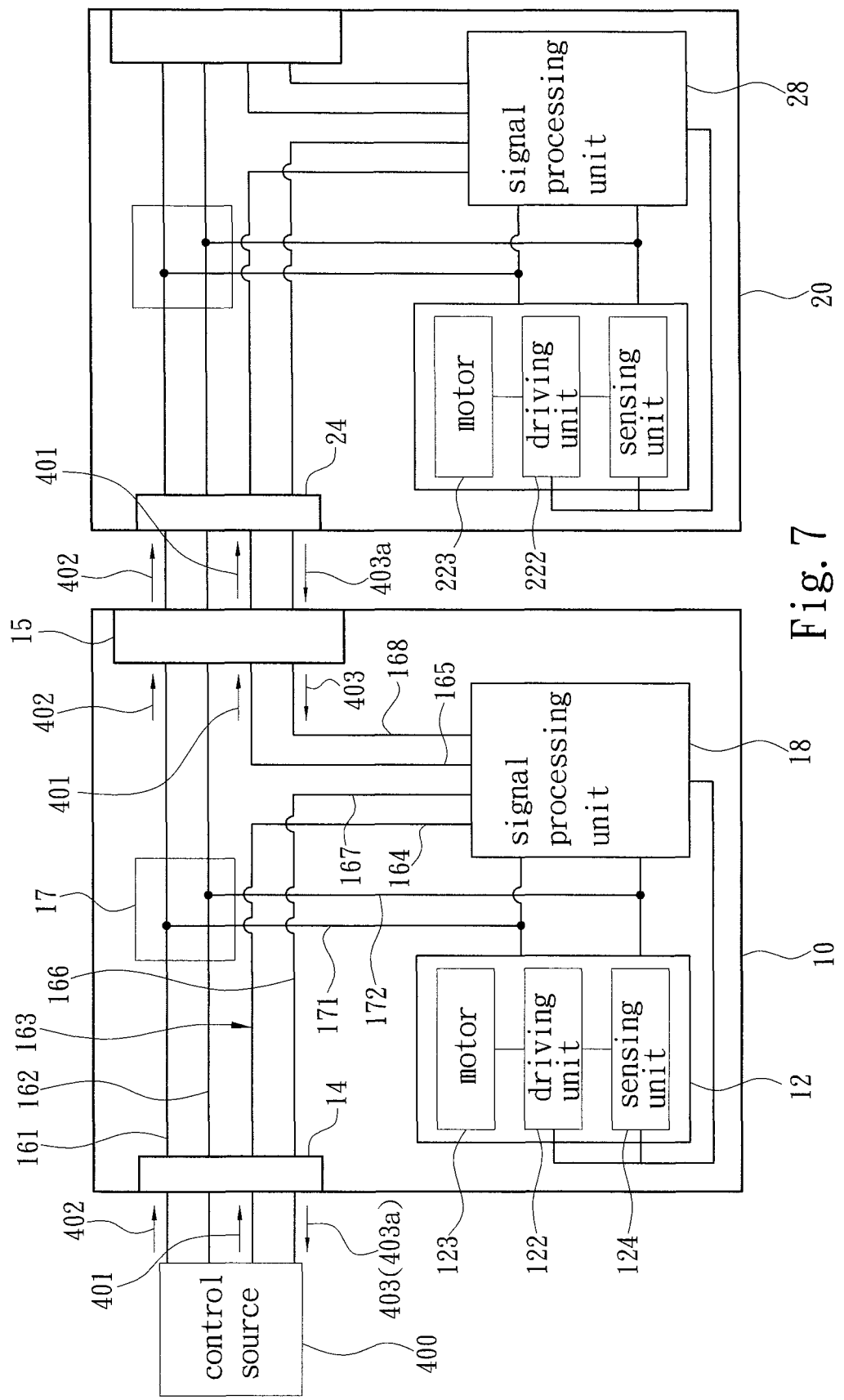

FAN TO BE USED AS A RELAY NODE

FIELD OF THE INVENTION

The present invention relates to a fan, and more particularly to a fan capable of acting as a signal transmission relay node.

BACKGROUND OF THE INVENTION

With the evolution of technology, the operational performance of electronic components such as processor on electronic devices is getting better and better. However, with the improvement of operational capacity, it means that the electronic components will generate huge amounts of energy consumption and waste heat. Once the electronic components fail to instantly dissipate heat, it will cause the electronic components to crash due to overheating. In order for the electronic device to operate properly, the heat of the electronic components needs to be dissipated. The current basic solution is to install a fan system on the electronic device. As disclosed in the Taiwan Patent No. TW I477056B, the conventional fan system comprises a master control fan unit, at least one signal conversion interface circuit, and at least one slaved control fan, wherein the master control fan unit comprises a microcontroller, and a master control fan electrically connected to the microcontroller, and the microcontroller generates a control signal to the master control fan. Moreover, the signal conversion interface circuit is electrically connected to the microcontroller, and converts the control signal received by the microcontroller into a complementary control signal, and the slaved control fan is electrically connected to the signal conversion interface circuit to receive the complementary control signal, and generates an operation opposite to the master control fan. In addition, the slaved control fan can also be directly connected to the master control fan.

However, in the foregoing patent, each of the slaved control fans is controlled by the master control fan unit or the signal conversion interface circuit, it requires the fan system to be added with a plurality of wires to connect the components. In addition, when the structure of the fan system mentioned above is intended to increase or decrease a number of the slaved control fans, the entire system will need to be rebuilt, and the user will be incapable of making adjustments quickly.

SUMMARY OF THE INVENTION

A main object of the present invention is to solve the problems of control and wiring derived from the conventional fan systems that still focus on a single master control source.

A secondary object of the present invention is to solve the problem that the conventional fan systems cannot allow a user to rapidly increase or decrease a number of fans.

In order to achieve the above objects, the present invention firstly provides a fan to be used as a relay node, the fan comprises a frame, a drive assembly disposed on the frame, and a fan blade driven by the drive assembly to rotate relative to the frame. The drive assembly comprises a circuit board, a driving unit disposed on the circuit board, and a motor electrically connected to the driving unit. Further, the fan comprises a male connect port, a transmission wire set, a female connect port, a power acquisition unit, and a signal processing unit. The male connect port is connected to a control source, and the transmission wire set comprises two power wires connected to the male connect port respectively, and a control wire connected to the male connect port. The female connect port is disposed on the frame and electrically connected to the male connect port via the transmission wire set, and the female connect port can be connected to the male connect port of another fan to allow the fan electrically connect with another fan. The power acquisition unit is connected in parallel with the two power wires to obtain a working power outputted by the control source to the two power wires, and the power acquisition unit is further connected to the driving unit to provide the working power. The signal processing unit is connected to the control wire and connected to the power acquisition unit and the driving unit, the signal processing unit receives a control signal provided by the control source via the control wire and outputs the control signal to the driving unit, and the signal processing unit acts as a relay node to output the control signal to the female connect port.

In one embodiment, the control wire comprises a first control wire segment connecting the male connect port and the signal processing unit, and a second control wire segment connecting the signal processing unit and the female connect port.

In one embodiment, the control signal comprises a rotational speed control command, and the driving unit comprises a first mode for receiving the control signal and controlling the motor to operate at a working rotational speed by the rotational speed control command, and a second mode in which the control signal is not received to cause the motor to operate at a preset rotational speed.

In one embodiment, the transmission wire set comprises a communication wire connecting the male connect port, the female connect port, and the signal processing unit, the fan comprises a sensing unit disposed on the circuit board and provides a fan operation signal to the signal processing unit, and the signal processing unit transmits the fan operation signal provided by the sensing unit of the fan or an operation signal of the another fan that received by the female connect port to the male connect port via the communication wire of the fan.

In one embodiment, the communication wire comprises a first communication wire segment connecting the male connect port and the signal processing unit, and a second communication wire segment connecting the signal processing unit and the female connect port.

In one embodiment, the male connect port is disposed at one of four end corners of the frame.

In one embodiment, the frame is formed with a carrying base for carrying the drive assembly, and a plurality of support ribs connecting the carrying base, and the transmission wire set is connected to the driving unit disposed on the circuit board via one of the plurality of support ribs.

In one embodiment, the female connect port is disposed on the circuit board.

In one embodiment, the frame is formed with a carrying base for carrying the drive assembly, the carrying base comprises a breach, and the female connect port is disposed at a side of the circuit board facing the carrying base and located in the breach.

In one embodiment, the female connect port is disposed at one of the four end corners of the frame.

With the foregoing implementation of the present invention, has the following features compared with the prior art: when the fan of the present invention is implemented in plural numbers, each of the fans is used as a relay node to transmit a signal to the other connected fan, that is, the fan of the present invention does not require the set up of a master control fan when constructing a fan system. Furthermore, the structure of the fan of the present invention allows a user to be capable of quickly adding or disassembling based on requirement.

BRIEF DESCRIPTION OF THE DRAWINGS

FIG. 7 is a circuit diagram of the fans connected in series according to still another embodiment of the present invention.

DETAILED DESCRIPTION OF THE PREFERRED EMBODIMENTS

The detailed description and technical content of the present invention are described with reference to the accompanying drawings as follows.

Figure 1:
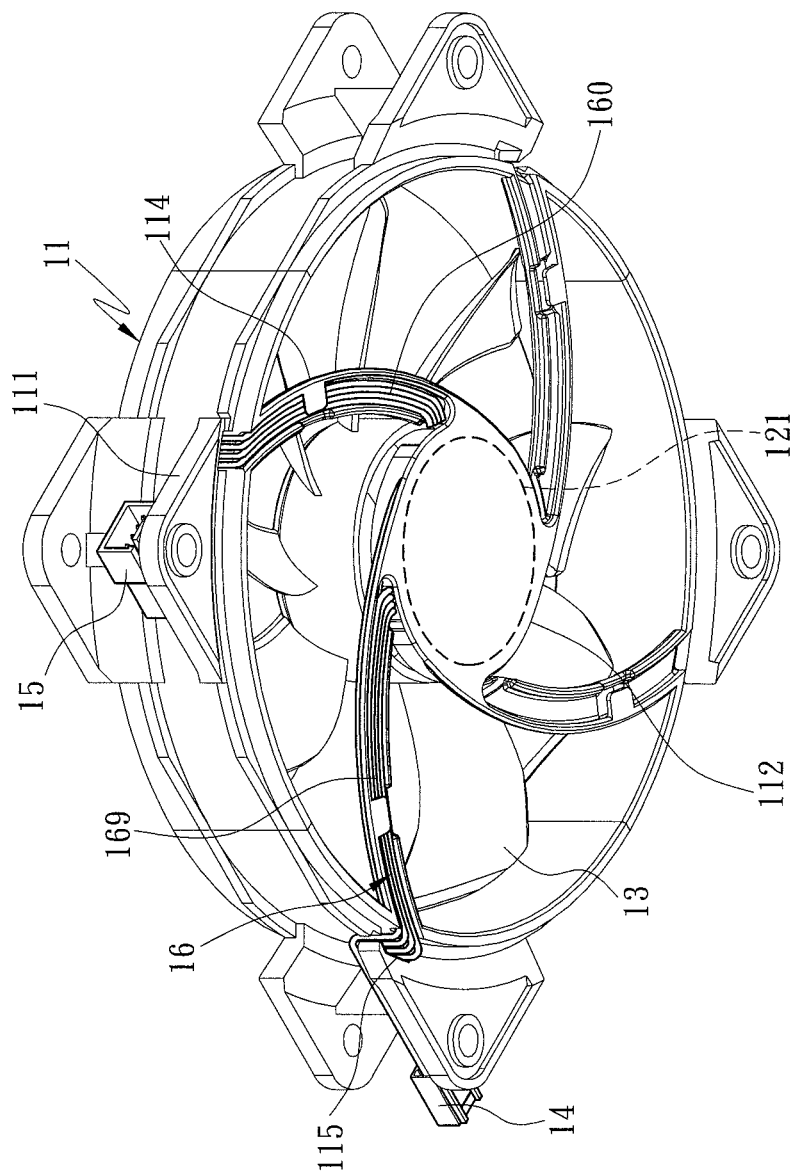
FIG. 1 is a schematic structural view of a fan according to an embodiment of the present invention.
Figure 2:
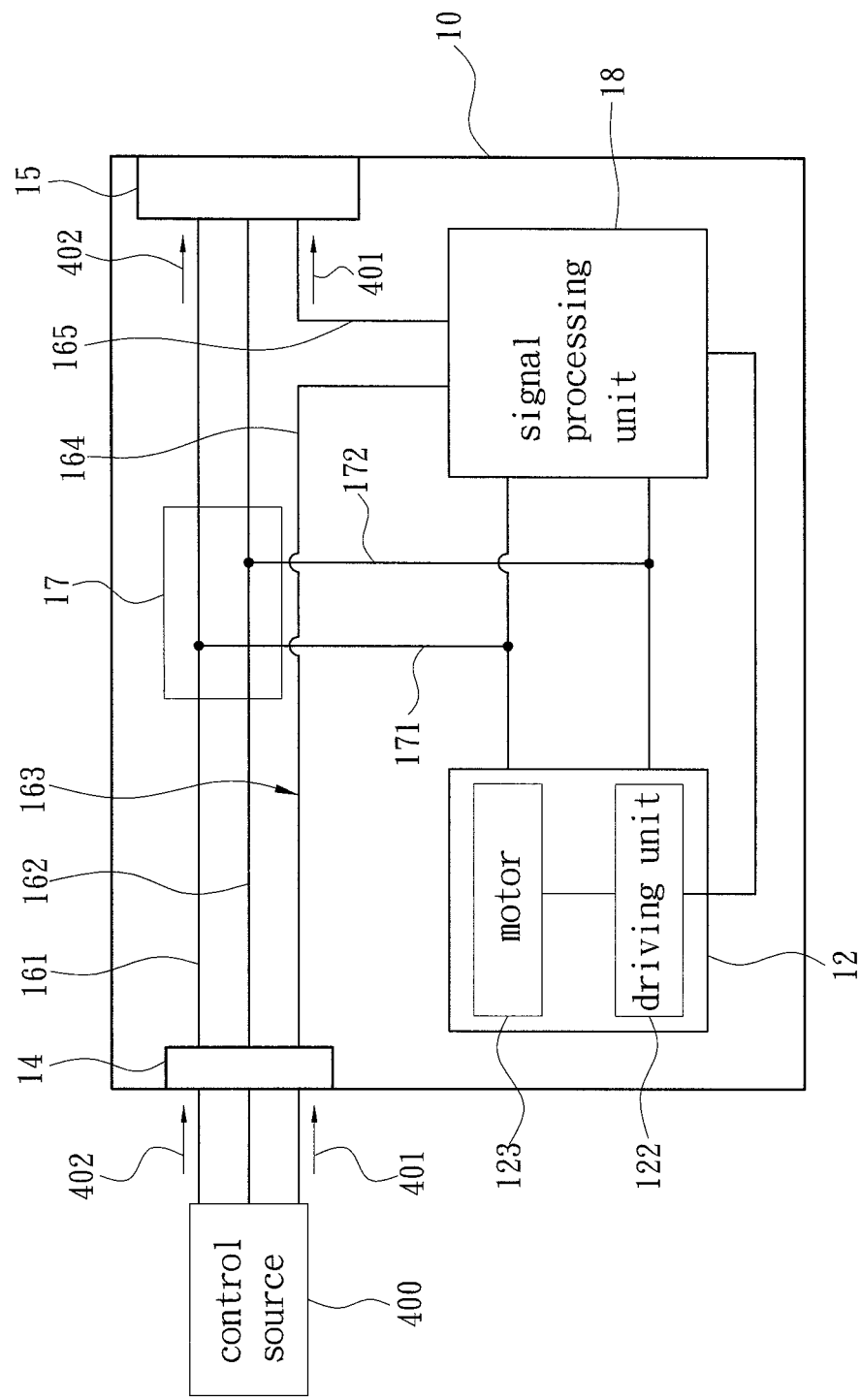
FIG. 2 is a circuit diagram of the fan according to an embodiment of the present invention.
Figure 3:
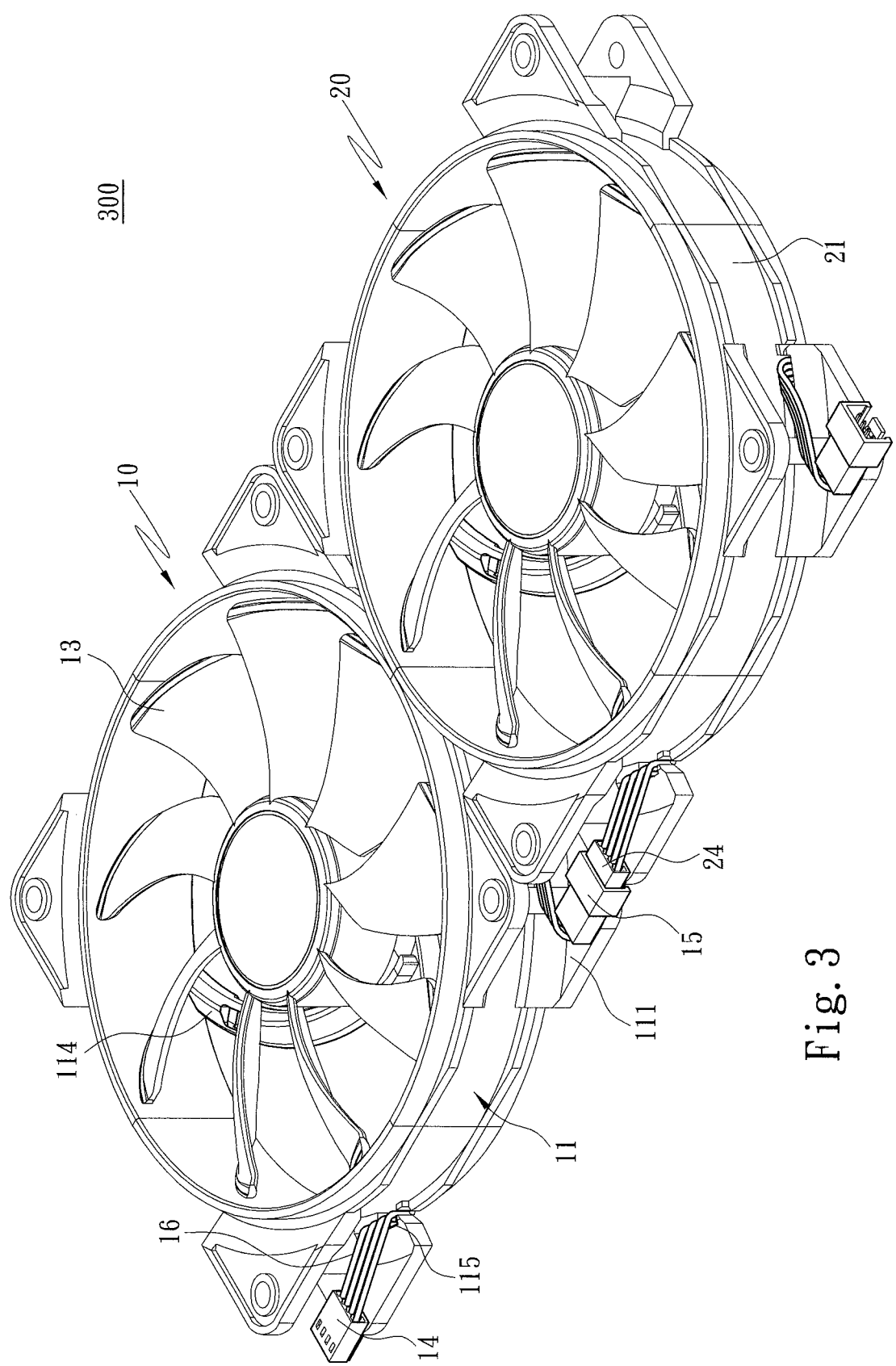
FIG. 3 is a schematic structural view of the fans connected in series according to an embodiment of the present invention.

Referring to FIGS. 1 and 2, the present invention provides a fan 10 which is used as a relay node. The fan 10 can be implemented alone or in combination with another fan 20 with the same structure to form a fan system 300, as shown in FIG. 3. First, the basic structure of the fan 10 is described as follows. The fan 10 comprises a frame 11, a drive assembly 12 and a fan blade 13, wherein the frame 11 is provided for disposing the drive assembly 12 thereon, and the drive assembly 12 comprises a circuit board 121, a driving unit 122, and a motor 123. The driving unit 122 is composed of a plurality of electronic components which are disposed on the circuit board 121, and the electronic components can be an integrated circuit, a capacitor, a resistor or an inductor respectively. Further, the motor 123 is connected to the driving unit 122 and is controlled by the driving unit 122 to rotate. Furthermore, the fan blade 13 is disposed corresponding to the frame 11 and connected to the motor 123, so as to generate a wind current upon rotating the motor 123 which is relative to the frame 11.

The fan 10 further comprises a male connect port 14, a female connect port 15, a transmission wire set 16, a power acquisition unit 17, and a signal processing unit 18. Wherein the male connect port 14 and the female connect port 15 are implemented by a same communication standard, and the male connect port 14 and the female connect port 15 are respectively connected to the transmission wire set 16. Further, the male connect port 14 of the present invention can be connected to a control source 400, a control signal 401 and a working power 402 can be obtained by the control source 400 for operational demand. The control source 400 referred to in the present invention can be a fan controller or a computer motherboard. Furthermore, the transmission wire set 16 is disposed on the frame 11, and the transmission wire set 16 is not connected to elements except the structure that belongs to the fan 10. Further, the transmission wire set 16 of the present invention comprises at least two power wires 161 and 162 for transmitting the working power 402 and a control wire 163 for transmitting the control signal 401. The power wires 161 and 162 as well as the control wire 163 are electrically connected to the male connect port 14 and the female connect port 15 respectively. Wherein one of the power wires 161 (162) can be a live wire (referred to as V+ in the technical field), the other one of the power wires 162 (161) is a ground wire (referred to as GND in the technical field), and the control wire 163 is used to transmit digit signals. Furthermore, the male connect port 14 of the present invention can be disposed on the frame 11 or extend beyond the frame 11 via a partial wire segment of the transmission wire set 16. On the other hand, the female connect port 15 of the present invention can be disposed on the frame 11 according to the implementation requirement. When the female connect port 15 is disposed on the frame 11, the female connect port 15 and the male connect port 14 are respectively located at one of four end corners 111 of the frame 11, as shown in FIG. 1, that is, the male connect port 14 and the female connect port 15 are respectively located at the different end corners 111.

Referring to FIGS. 1 and 2, the power acquisition unit 17 of the present invention connects with the two power wires 161, 162 in parallel, that is, the normality of the power acquisition unit 17 does not affect the two power wires 161, 162. In one embodiment, the power acquisition unit 17 is composed of two power transmission wires 171 and 172; that is, the power acquisition unit 17 of the present invention is not necessarily provided with functions such as power conversion or power regulation. Moreover, the power acquisition unit 17 is electrically connected to the driving unit 122 and the signal processing unit 18 to provide the working power 402 to the driving unit 122 and the signal processing unit 18. On the other hand, the signal processing unit 18 of the present invention is connected to the control wire 163 to receive the control signal 401, and transmits the control signal 401 to the driving unit 122, so that the driving unit 122 controls the operation of the motor 123 based on the control signal 401, thereby adjusting a rotational speed of the fan blade 13. Furthermore, the signal processing unit 18 of the present invention further acts as a relay node, and transmits the received control signal 401 to the female connect port 15 via the control wire 163. More specifically, the control wire 163 of the present invention comprises a first control wire segment 164 connecting to the male connect port 14 and the signal processing unit 18, and a second control wire segment 165 connecting to the signal processing unit 18 and the female connect port 15.

Figure 4:
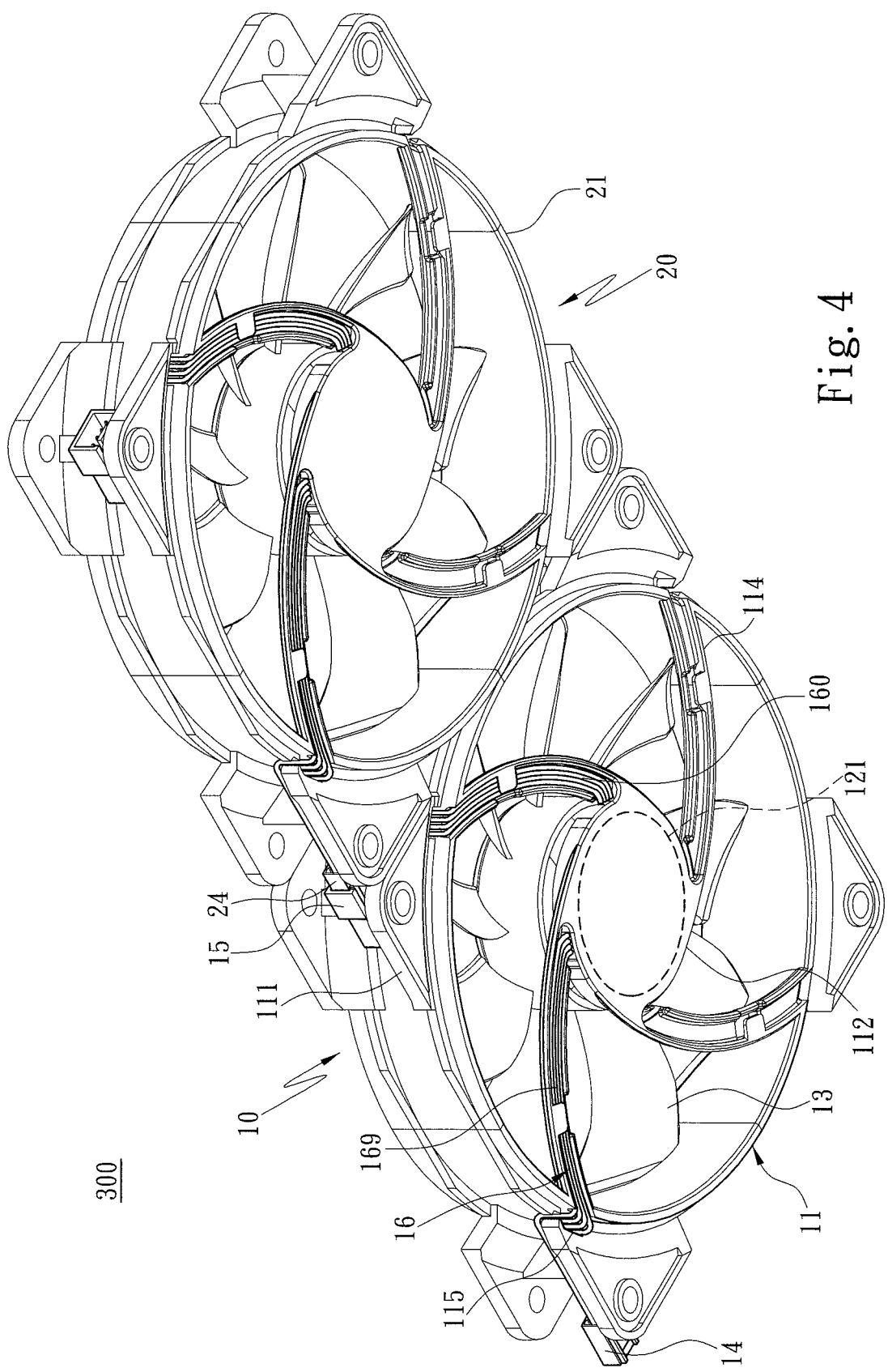
FIG. 4 is a schematic structural view of the fans connected in series according to an embodiment of the present invention viewed from another direction.
Figure 5:
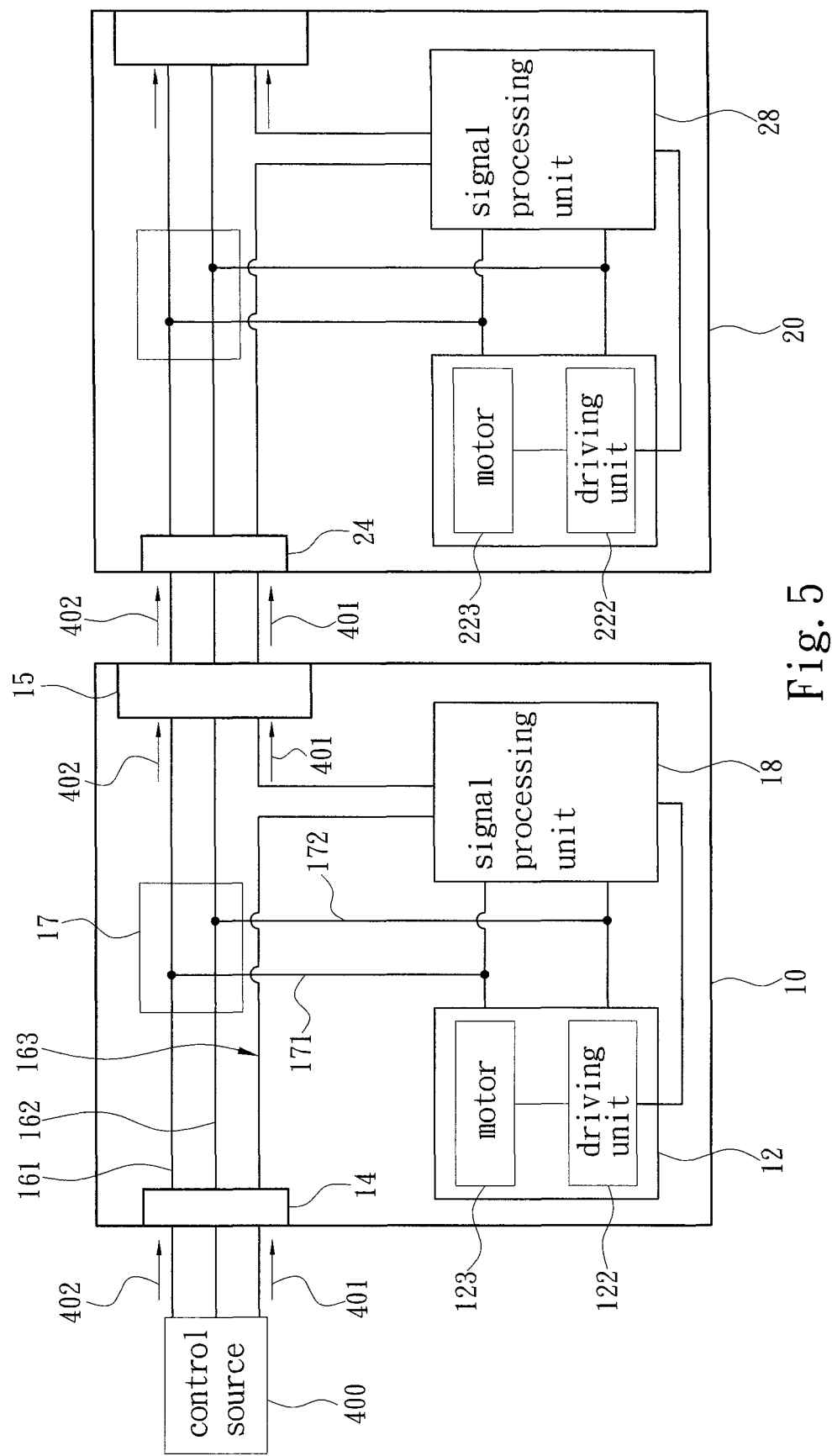
FIG. 5 is a circuit diagram of the fans connected in series according to an embodiment of the present invention.

Referring to FIGS. 3, 4 and 5, it can be known from the foregoing that the fan 10 of the present invention is implemented in combination with the fan 20 with the same structure to form the fan system 300. In the implementation, the male connect port 14 of the fan 10 is connected to the control source 400, and the female connect port 15 of the fan 10 is connected to a male connect port 24 of the fan 20. At this time, the fan 10 is linearly arranged with the fan 20, and the frame 11 of the fan 10 is closely connected to a frame 21 of the fan 20, as depicted in FIGS. 3 and 4. Therefore, when the fan 10 connected to the control source 400 receives the working power 402 and the control signal 401, the working power 402 is inputted to the driving unit 122 and the signal processing unit 18 via the power acquisition unit 17, and the working power 402 is also transmitted to the fan 20 via the two power wires 161, 162 so that the working power 402 is obtained by the fan 20 for operation. On the other hand, the control signal 401 is inputted to the signal processing unit 18 via the control wire 163. In addition to inputting the control signal 401 to the driving unit 122, the signal processing unit 18 further outputs the received control signal 401 to the female connect port 15 via the control wire 163, so as to allow the fan 20 operating based on the control signal 401. It can be known from the above that according to the linear arrangement of the fan 10 and the fan 20, the control signal 401 and the working power 402 of the fan 20 are obtained from the fan 10, and therefore, the fan 10 is regarded as the source of signal and power supply for the fan 20.

Referring to FIGS. 3, 4 and 5, in one embodiment, the control signal 401 further comprises a rotational speed control command, and the driving unit 122 of the fan 10 comprises a first mode for receiving the control signal 401 and controlling the motor 123 to operate at a working rotational speed by the rotational speed control command, and a second mode to allow the motor 123 operating at a preset rotational speed without receiving the control signal 401. More specifically, when the fan 10 obtains the control signal 401 from the control source 400, the driving unit 122 enters the first mode and operates based on the rotational speed control command included in the control signal 401. On the contrary, when the control signal 401 is not obtained from the control source 400 after the fan 10 started, the driving unit 122 enters the second mode and operates at the preset rotational speed. The preset rotational speed referred to herein is a maximum or minimum rotational speed of the motor 123. Furthermore, when the fan 10 is implemented in plural numbers to construct the fan system 300, once the fan 20 does not receive the control signal 401 transmitted by the fan 10 which is disposed in front of the fan 20, the driving unit 222 of the fan 20 enters the second mode, so as to allow the motor 223 of the fan 20 operating at the preset rotational speed. It can be known from the above that the present invention solves the problem that once the master of the conventional fan system is abnormal, each of the fans of the conventional fan system will be unable to operate.

Figure 6:
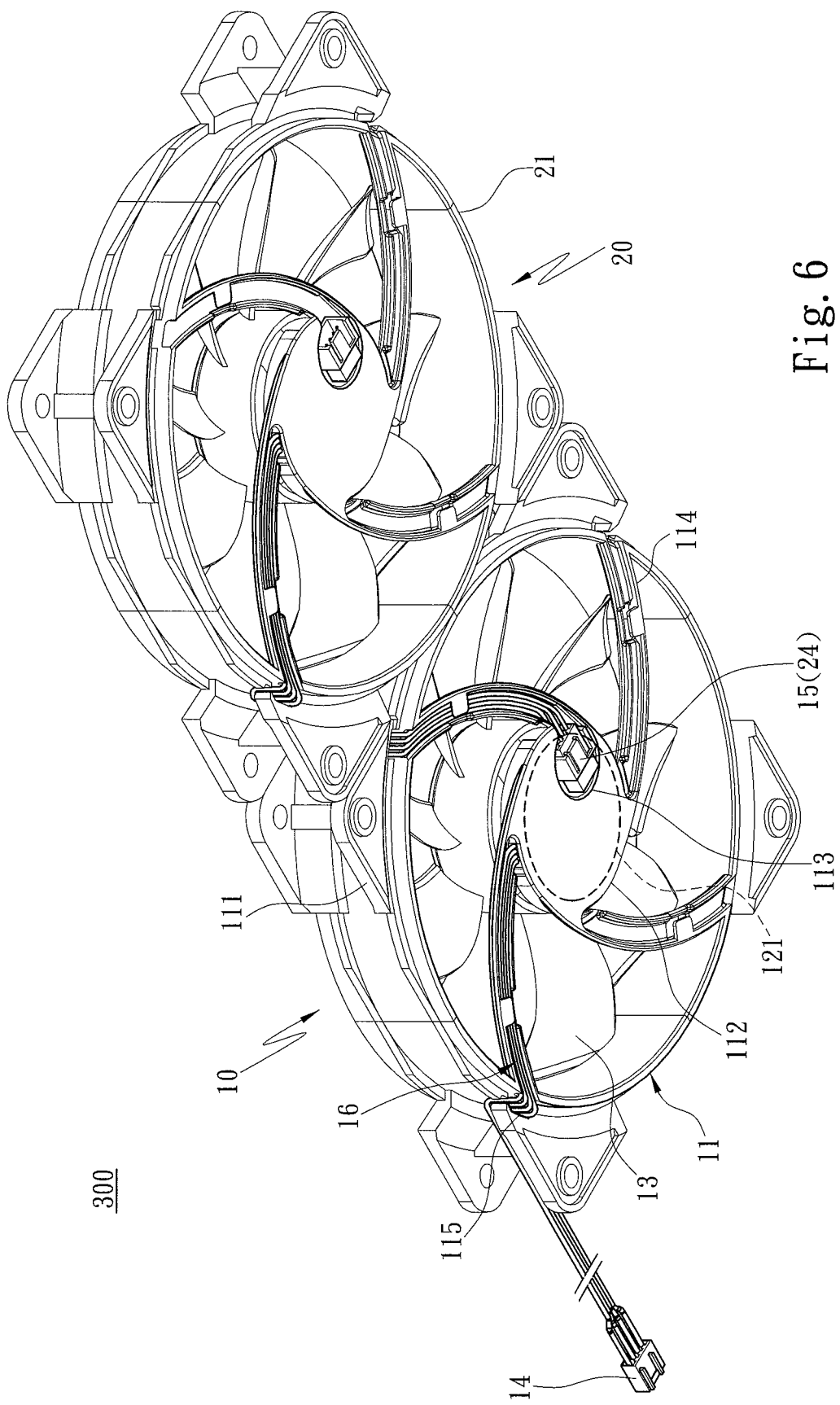
FIG. 6 is a schematic structural view of the fans connected in series according to another embodiment of the present invention.

Referring to FIGS. 6 and 7, in one embodiment, the drive assembly 12 further comprises a sensing unit 124 disposed on the circuit board 121, the sensing unit 124 is used to detect a working state of the fan 10, and the working state can be fan rotational speed, fan temperature, fan noise, and the like. In this embodiment, the signal processing unit 18 can be worked with the sensing unit 124 to perform rotational speed monitoring, temperature monitoring, noise monitoring, and the like on the fan 10. Specifically, when the sensing unit 124 is used to sense the rotational speed of the fan 10, the signal processing unit 18 receives a current rotational speed signal from the sensing unit 124, and controls the motor 123 based on the final set operation. Moreover, when the sensing unit 124 is used to sense the temperature of the fan 10, the signal processing unit 18 receives a fan temperature signal from the sensing unit 124, and controls the driving unit 122 whether changes the operating state to prevent the temperature of the fan 10 from being too high based on the set temperature condition. In addition, when the sensing unit 124 is used to sense the operating volume of the fan 10, the signal processing unit 18 receives a fan volume signal from the sensing unit 124, and controls the motor 123 based on a noise limiting condition set for the signal processing unit 18, so as to the motor 123 moderately decelerating the speed to prevent the fan 10 from operating too loudly and being regarded as noise by a user. On the other hand, in this embodiment, the transmission wire set 16 further comprises a communication wire 166 connecting the male connect port 14, the female connect port 15 and the signal processing unit 18, and the sensing unit 124 connects to the signal processing unit 18 and transmits a fan operation signal 403. The signal processing unit 18 receives the fan operation signal 403, and then transmits the fan operation signal 403 to the control source 400 via the communication wire 166, so that the control source 400 can obtain the state of the fan 10 to which it belongs by reading the fan operation signal 403. Further, the communication wire 166 of the present invention comprises a first communication wire segment 167 connecting the male connect port 14 and the signal processing unit 18, and a second communication wire segment 168 connecting the signal processing unit 18 and the female connect port 15.

Further, the fan 10 of the present invention can be implemented in plural numbers to form the fan system 300, and the fan 20 also transmits a fan operation signal 403a. In order to distinguish the fan operation signal 403 (403a) transmitted by each of the fans 10 (20), in one embodiment, the signal processing unit 18 of the fan 10 and a signal processing unit 28 of the fan 20 are respectively defined with a device identification code. When each of the signal processing units 18 (28) transmits the fan operation signal 403(403a) to the control source 400, each of the signal processing units 18 (28) writes the device identification code to which it belongs into the fan operation signal 403(403a), so that the control source 400 can distinguish the state of each of the fans 10 (20) based on the device identification code included in the fan operation signal 403(403a) of each of the fans 10 (20). Further, the control source 400 can also display the fan operation signals 403(403a) of the fans 10 (20) on a monitor for the user to observe.

Referring to FIG. 6, in one embodiment, the female connect port 15 of the present invention can be disposed on the circuit board 121 in addition to the foregoing ways of implementation. When the female connect port 15 is disposed on the circuit board 121, the circuit board 121 is disposed on a carrying base 112 provided by the frame 11. The carrying base 112 is disposed with a breach 113, and the female connect port 15 is located in the breach 113 and faces a side of the carrying base 112.

Referring to FIGS. 1 and 2, the frame 11 of the present invention is formed with a plurality of support ribs 114 connecting the carrying base 112. Further, the transmission wire set 16 of the present invention is connected to the driving unit 122 provided on the circuit board 121 via one of the support ribs 114. In one embodiment, the transmission wire set 16 is further composed of two wire segments 169, 160 respectively disposed at one of the support ribs 114 and connected to the circuit board 121. The two wire segments 169, 160 further form an electrical connection via a printed circuit (not shown in the figures) on the circuit board 121. In addition, the frame 11 further comprises a plurality of thread holes 115 respectively disposed at one of the end corners 111 for one of the two wire segments 169 and 160 to thread through.

In addition, the fan 10 can also be provided with at least one illuminating component, and the illuminating component can obtain the working power 402 from the power acquisition unit 17, and receive a illuminating signal provided by the control source 400 from the signal processing unit 18 to illuminate. Further, in addition to receiving the illuminating signal, the signal processing unit 18 can directly cause the illuminating components to illuminate according to a preset command, wherein the preset command referred to herein is an illuminating setting preset at the time of delivery of the fan 10 from the factory.

What is claimed is:

1. A fan to be used as a relay node, the fan comprising a frame, a drive assembly disposed on the frame, and a fan blade driven by the drive assembly to rotate relative to the frame, the drive assembly comprising a circuit board, a driving unit disposed on the circuit board, and a motor electrically connected to the driving unit, the fan comprising:
   a male connect port connected to a control source;
   a transmission wire set comprising two power wires connected to the male connect port respectively, and a control wire connected to the male connect port;
   a female connect port disposed on the frame and electrically connected to the male connect port via the transmission wire set, and the female connect port connected to a male connect port of another fan to allow the fan electrically connect with another fan;
   a power acquisition unit connected in parallel with the two power wires to obtain a working power outputted by the control source to the two power wires, and the power acquisition unit further connected to the driving unit to provide the working power; and
   a signal processing unit connected to the control wire and connected to the power acquisition unit and the driving unit, the signal processing unit receiving a control signal provided by the control source via the control wire and outputting the control signal to the driving unit, and the signal processing unit acting as a relay node to output the control signal to the female connect port.

2. The fan to be used as a relay node as claimed in claim 1, wherein the control wire comprises a first control wire segment connecting the male connect port and the signal processing unit, and a second control wire segment connecting the signal processing unit and the female connect port.

3. The fan to be used as a relay node as claimed in claim 1, wherein the control signal comprises a rotational speed control command, and the driving unit comprises a first mode for receiving the control signal and controlling the motor to operate at a working rotational speed by the rotational speed control command, and a second mode to allow the motor operating at a preset rotational speed without receiving the control signal.

4. The fan to be used as a relay node as claimed in claim 1, wherein the transmission wire set comprises a communication wire connecting the male connect port, the female connect port, and the signal processing unit, the fan comprises a sensing unit disposed on the circuit board and provides a fan operation signal to the signal processing unit, and the signal processing unit transmits the fan operation signal provided by the sensing unit of the fan or an fan operation signal of another fan that received by the female connect port to the male connect port via the communication wire of the fan.

5. The fan to be used as a relay node as claimed in claim 4, wherein the communication wire comprises a first communication wire segment connecting the male connect port and the signal processing unit, and a second communication wire segment connecting the signal processing unit and the female connect port.

6. The fan to be used as a relay node as claimed in claim 1, wherein the male connect port is disposed at one of four end corners of the frame.

7. The fan to be used as a relay node as claimed in claim 1, wherein the frame is formed with a carrying base for carrying the drive assembly, and a plurality of support ribs connecting the carrying base, and the transmission wire set is connected to the driving unit disposed on the circuit board via one of the plurality of support ribs.

8. The fan to be used as a relay node as claimed in claim 7, wherein the female connect port is disposed on the circuit board.

9. The fan to be used as a relay node as claimed in claim 8, wherein the frame is formed with a carrying base for carrying the drive assembly, the carrying base comprises a breach, and the female connect port is disposed at a side of the circuit board facing the carrying base and located in the breach.

10. The fan to be used as a relay node as claimed in claim 1, wherein the female connect port is disposed at one of the four end corners of the frame.

11. The fan to be used as a relay node as claimed in claim 1, wherein the female connect port is disposed on the circuit board.

* * * * *